US 6,563,578 B2

(12) United States Patent
Halliyal et al.

(10) Patent No.: US 6,563,578 B2
(45) Date of Patent: May 13, 2003

(54) IN-SITU THICKNESS MEASUREMENT FOR USE IN SEMICONDUCTOR PROCESSING

(75) Inventors: Arvind Halliyal, Sunnyvale, CA (US); Khoi A. Phan, San Jose, CA (US); Bhanwar Singh, Morgan Hill, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 35 days.

(21) Appl. No.: 09/824,112

(22) Filed: Apr. 2, 2001

(65) Prior Publication Data

US 2002/0142493 A1 Oct. 3, 2002

(51) Int. Cl.[7] ................................................. G02N 21/00

(52) U.S. Cl. .................................................... 356/237.4

(58) Field of Search .......................... 438/14; 219/411, 219/396, 121.85; 356/369, 73, 381, 237.4

(56) References Cited

U.S. PATENT DOCUMENTS

| 5,313,004 A | * | 5/1994 | Massoud ................ 219/121.85 |
| 6,020,957 A | * | 2/2000 | Rosengaus ............... 356/237.4 |
| 6,111,225 A | * | 8/2000 | Ohkase ........................ 219/390 |
| 6,113,733 A |   | 9/2000 | Eriguchi et al. |
| 6,117,348 A |   | 9/2000 | Peng et al. |

* cited by examiner

Primary Examiner—John F. Niebling
Assistant Examiner—Andre C Stevenson
(74) Attorney, Agent, or Firm—Amin & Turocy, LLP

(57) ABSTRACT

A system and method are disclosed for providing in-situ monitoring of thin film thickness, such as by employing a non-destructive optical measurement technique. The monitored film thickness may be employed to help achieve a desired feature film thickness and uniformity across a surface of a substrate. By monitoring film thickness during semiconductor processing, for example, one or more process control parameters may be adjusted to help achieve a desired film thickness and/or uniformity thereof.

21 Claims, 11 Drawing Sheets

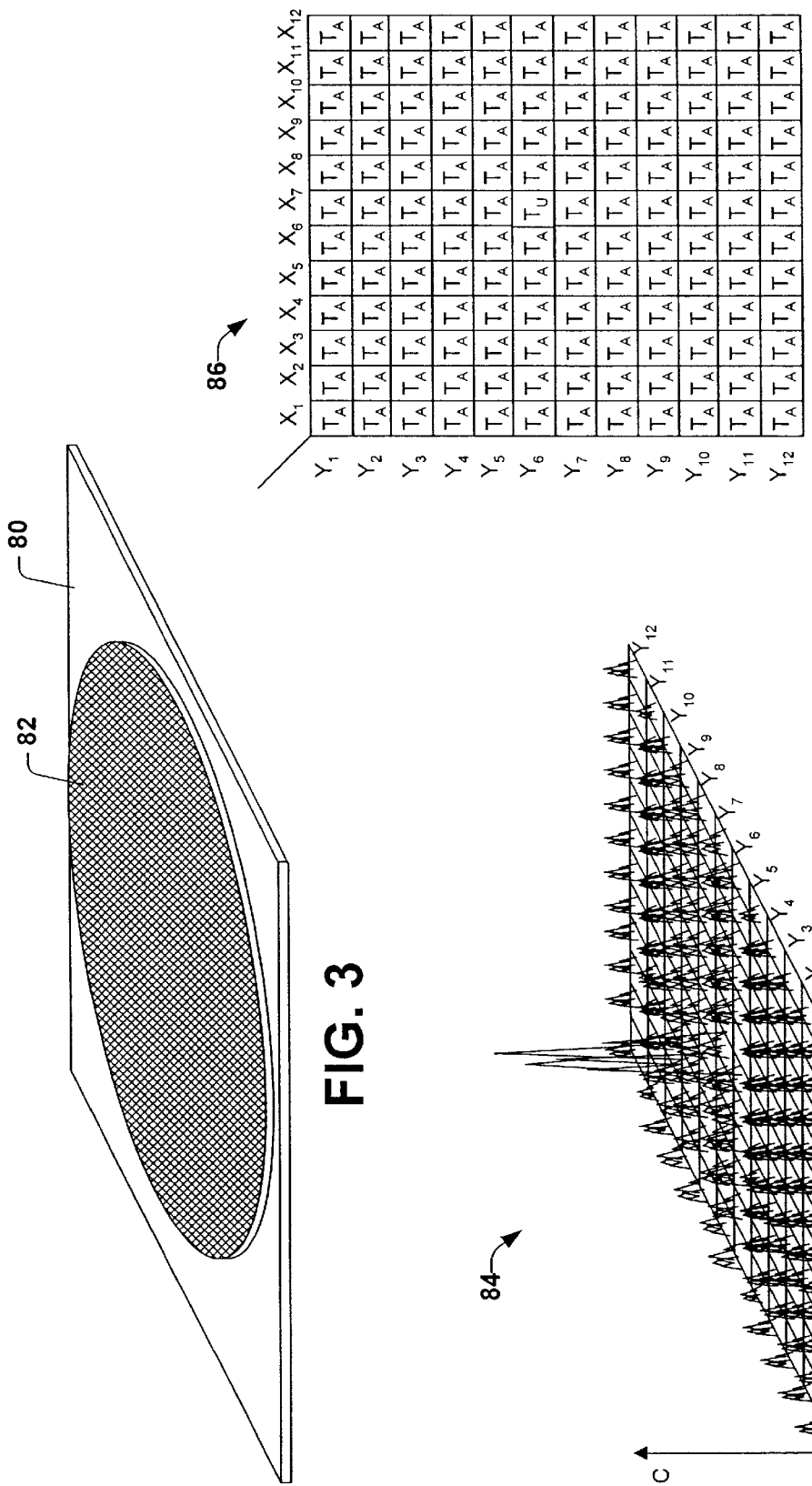

IN-SITU THICKNESS MEASUREMENT FOR USE IN SEMICONDUCTOR PROCESSING

FIELD OF THE INVENTION

The present invention generally relates to semiconductor processing and, more particularly, to in-situ thickness measuring of thin films during semiconductor processing.

BACKGROUND OF THE INVENTION

In the semiconductor industry, there is a continuing trend toward higher device densities. To achieve these high densities there has been and continues to be efforts toward scaling down device dimensions (e.g., at submicron levels) on semiconductor wafers. In order to accomplish such high device packing density, smaller and smaller feature sizes are required. This may include the width and spacing of interconnecting lines, spacing and diameter of contact holes, and the surface geometry such as corners and edges of various features.

The requirement of small features with close spacing between adjacent features requires high resolution photolithographic processes. In general, lithography refers to processes for pattern transfer between various media. It is a technique used for integrated circuit fabrication in which a silicon slice, the wafer, is coated uniformly with a radiation-sensitive film, the resist, and an exposing source (such as optical light, x-rays, or an electron beam) illuminates selected areas of the surface through an intervening master template, the mask, for a particular pattern. The lithographic coating is generally a radiation-sensitive coating suitable for receiving a projected image of the subject pattern. Once the image is projected, it is indelibly formed in the coating. The projected image may be either a negative or a positive image of the subject pattern. Exposure of the coating through a photomask causes the image area to become either more or less soluble (depending on the coating) in a particular solvent developer. The more soluble areas are removed in the developing process to leave the pattern image in the coating as less soluble polymer.

A large variety of "thin films" are used in the fabrication of semiconductor devices. These films may be thermally grown or deposited from a vapor phase. The thin films may, for example, be metals, semiconductors (e.g., oxides, nitrides, and poly, oxynitrides), or insulators. Due to the extremely fine patterns and dimensions of features that are formed on a substrate, thickness of a deposited film is a significant factor in achieving desired critical dimensions. By way of example, very low densities of both particulate defects and film imperfections, such as pinholes, become critical for the small linewidths, high densities, and large areas necessary for VLSI. These small geometries also create highly rugged topography for overlying films to cover.

The formation of thin films is accomplished by a variety of techniques, which can conceptually be divided into two groups: 1) film growth by interaction of vapor-deposited species with the substrate; and 2) film formation by deposition without causing changes to the substrate material. The first category includes thermal oxidation and nitridation of single crystal silicon and polysilicon, and the formation of silicides by direct reaction of a deposited metal and the substrate.

The second group includes other subclasses of deposition: a) chemical vapor deposition, or CVD, in which solid films are formed on a substrate by the chemical reaction of vapor phase chemicals that contain the required constituents; b) physical vapor deposition, or PVD, in which the species of the thin film are physically dislodged from a source (to form a vapor). The species is transported across a reduced pressure region to the substrate to form the solid thin film.

Typically several process steps, which may include thin film growth and/or deposition, are required to form a desired feature. Typically, measurements concerning the thickness of films applied during such deposition processes are made after corresponding processing steps have been completed. Slight variations in the film thickness, however may greatly affect the operation of a resulting semiconductor device.

Consequently, if the thickness is not within an expected range, the process parameters may need to be modified and the process steps repeated to produce a thin film having the desired film thickness. In addition, because the thickness is measured after the process has been completed, it tends to be difficult to determine which parameters should be modified and the extent to which they should be modified to achieve a desired film thickness.

SUMMARY

The present invention relates to a system and method for providing in-situ thickness and process monitoring to help achieve a desired feature thickness. By monitoring film thickness during semiconductor processing, one or more process control parameters may be adjusted to help achieve a desired film thickness. As a result, the number of process steps required to achieve the desired film thickness may be reduced, providing a more efficient and economical process.

One aspect of the present invention provides a semiconductor processing system. The system includes a processing chamber operable to form a thin film on a substrate located in the chamber. A measurement system performs in-situ thickness measurements of the thin film being formed and provides a measurement signal indicative of the measured thickness. In accordance with another aspect of the present invention, the measured thickness further may be employed for process control to help achieve a desired film thickness.

Yet another aspect of the present invention provides a method to facilitate formation of a thin film on a substrate. The method includes forming the thin film on the substrate and measuring film thickness of the thin film while being formed at the substrate.

To the accomplishment of the foregoing and related ends, certain illustrative aspects of the invention are described herein in connection with the following description and the annexed drawings. These aspects are indicative, however, of but a few of the various ways in which the principles of the invention may be employed and the present invention is intended to include all such aspects and their equivalents. Other advantages and novel features of the invention will become apparent from the following detailed description of the invention when considered in conjunction with the drawings.

BRIEF DESCRIPTION OF THE DRAWINGS

FIG. 3 is a perspective illustration of a substrate which can be fabricated in accordance with the present invention.

FIG. 4 is a representative three-dimensional grid map of a wafer illustrating feature profile measurements taken at grid blocks of the grid map in accordance with the present invention.

FIG. 5 is a measurement table correlating the measurements of FIG. 4 with desired values for the feature profiles in accordance with the present invention.

DETAILED DESCRIPTION OF THE INVENTION

Figure 1:
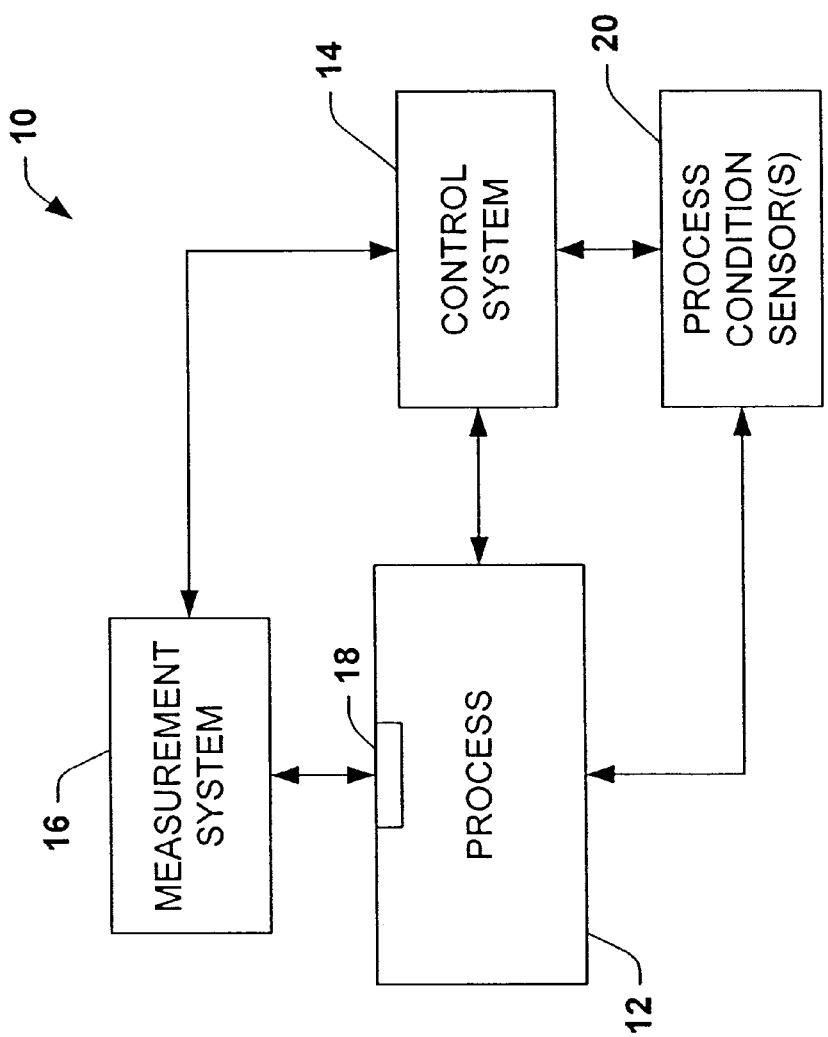
FIG. 1 is a diagrammatic block representation of a system in accordance with the present invention.

FIG. 1 illustrates a system 10 for in-situ of thickness measurements of applied materials, such as thin films being formed in a semiconductor process, schematically indicated at 12. The process 12, for example, includes thin film growth, etching, and/or thin film deposition.

The system 10 also includes a control system 14 for controlling operating characteristics of the process 12. The operating characteristics associated with the process 12 may include, for example, the temperature, concentration of gases within the process, pressure associated with the process, and timing parameters associated with different steps in a multi-step fabrication process. The control system 14 may adjust one or more selected operating parameters of the process based on sensed operating conditions associated with the process 12.

A measurement system 16 is operatively associated with the process 12 to measure in-situ thickness of the thin film while it is being formed. That is, the measurement system 16 includes a thickness monitoring portion 18, which may be located within (or be integrated into) the process 12, such as may include an enclosed processing chamber. The measurement system 16, for example, samples the thickness of layers being formed on the substrate at one or more locations, such as near the center and near one or more edge locations of the substrate. In particular, it may be desirable to obtain measurements from two or more spaced apart locations, such as at the center and one or more edge positions. Such measurements may enable a better determination as to uniformity of the film thickness, which in accordance with an aspect of the present invention, may be employed to adjust the fabrication process to achieve a desired level of uniformity of film thickness.

The measurement system 16 may implement any known technique operable to measure the thickness of the thin film being formed in the process 12. Examples of techniques that may be utilized in accordance with an aspect of the present invention include optical interference, ellipsometry, capacitance, and use of an associated color chart. Microprocessor controlled optical interference (e.g., microspectrophotometry) and spectroscopic ellipsometry are two common types of optical measurement techniques that could be utilized.

By way of further illustration, scatterometry may be employed to extract information about a surface of a substrate upon which an incident light has been directed. One or more gratings may be located on a substrate. Such gratings may be formed on the substrate, for example, at the same stage in fabrication when alignment markers are formed thereon, such as by etching. Light reflected, and/or passed through, the one or more gratings and/or features is collected by one or more light detecting components of the measurement system 16. It is to be appreciated that any suitable scatterometry system may be employed to carry out the present invention, and such systems are intended to fall within the scope of the claims.

Those skilled in the art will understand and appreciate other techniques that also could be employed for performing in-situ film thickness measurements, all of which are contemplated as falling within the scope of the present invention. The particular technique utilized in the system 10 may further vary according the type of thin film and the thickness of the film being formed in the process 12.

Advantageously, the measurement system 16, 18 is able to measure in-situ properties of various types of thin films, such as oxides, nitrides, and poly, oxynitride. It also may be applied to metal films, such as, for example, aluminum, copper, Titanium-nitride, tungsten, argon as well as films used for silicide formation, such as Titanium, Cobalt, and Nickel, to name a few. Those skilled in the art will understand and appreciate that the present invention is equally applicable to formation of the other types of thin films.

The measurement system 16 is coupled to the control system 14 for providing a signal indicative of the measured film thickness being formed in the process 12. The control system 14, for example, includes memory (not shown) for storing a target film thickness, which may vary according to the process. For example, by examining a signal (signature) library of intensity/phase signatures, a determination can be made concerning the properties of the surface, such as the thickness of the film being formed thereon. The control system 14 may be programmed and/or configured to compare the measured thickness relative to the target thickness and determine what action (if any) should be taken to drive the process 12 so that a target thickness and/or a desired level of uniformity of thickness may be achieved.

The system 10 further may include one or more other process sensors 20 for monitoring process operating conditions and providing an indication of such conditions to the control system 14. The control system 14 thus is able to adjust process operating characteristics based on the measured thickness (e.g., based on a signal from the measurement system 16) and the sensed process operating conditions (e.g., based on a signal from the other process sensors 20). In this way, the control system 14 may selectively refine the film formation process 12 to accommodate variations in sensed process conditions and measured film thickness at various stages of the film formation process. For example, the control system 14 may adjust gas flow rates, pressure, temperature, thermal oxidation time, and/or film formation time (e.g., deposition time or film growth time) based on the conditions monitored by the measurement system 16 and the sensor(s) 20. As a result, the system 10 is capable of achieving a more precise and/or uniform film thickness without an increase in process steps to refine the process.

Figure 2:
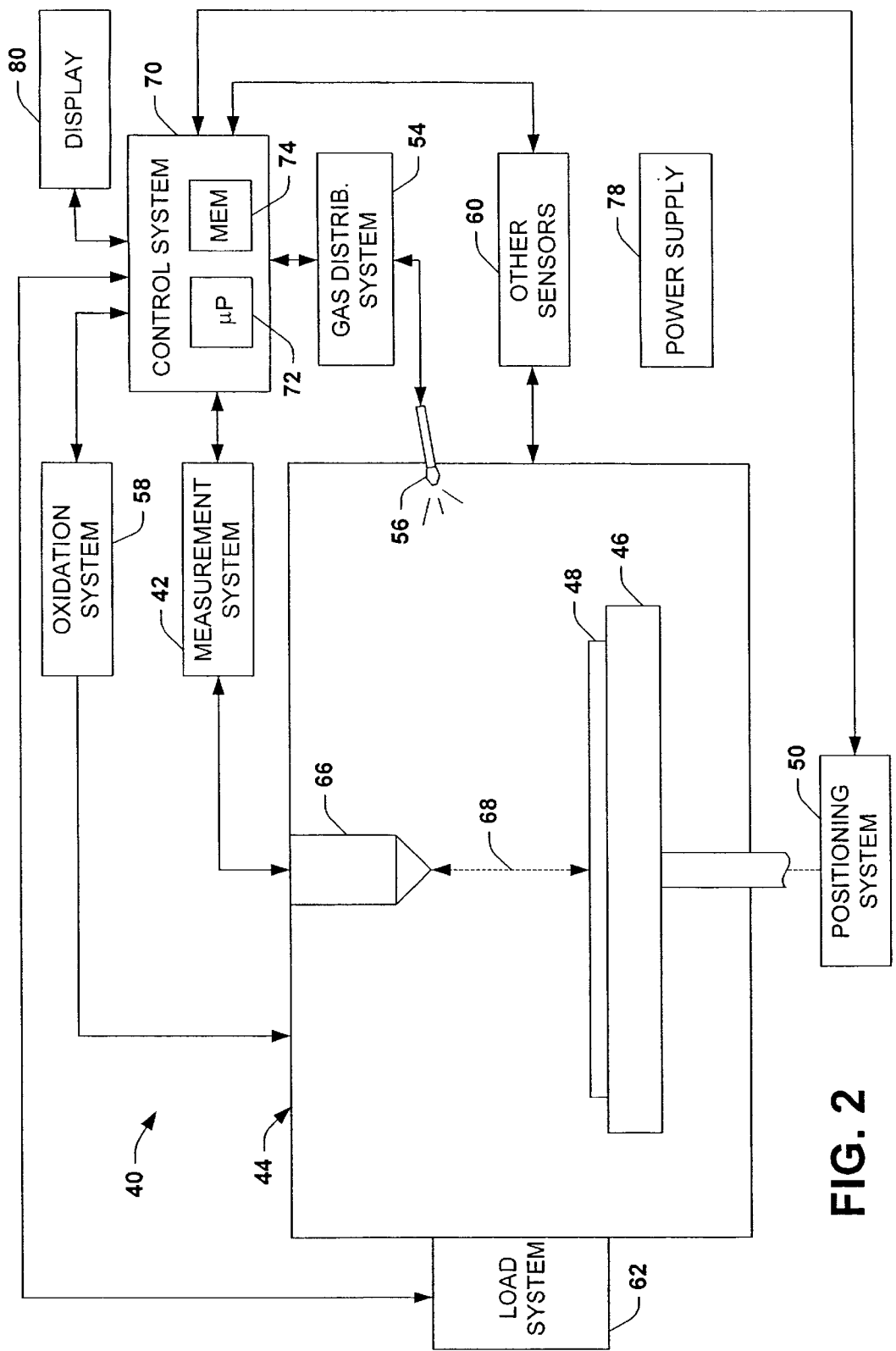
FIG. 2 is a functional block diagram of a system in accordance with the present invention.

FIG. 2 illustrates another example of a system 40 having a measurement system 42 for in-situ film thickness monitoring in accordance with an aspect of the present invention. In this example, the system 40 forms the film by deposition. Examples of CVD processes that may be utilized, in accordance with an aspect of the present invention, include Low Pressure CVD (LPCVD), Plasma Enhanced CVD (PECVD), and Rapid Thermal CVD (RTCVD). It is to be appreciated, however, that the present invention is applicable to other types of thin film formation, such as other deposition techniques (e.g., Physical Vapor Deposition (PVD), Metal Organic Chemical Vapor Deposition (MOCVD), Pulsed Laser Deposition (PLD)) and film growth techniques.

The system 40 includes a process chamber 44 that includes a support, such as may include a stage 46 (or chuck) operative to support a substrate 48, such as a wafer. A positioning system 50 is operatively connected to the support 46 for positioning the stage 46 at a desired position within the chamber 44. It is to be appreciated that wafer positioning systems are rapidly evolving and that any such system may be employed in accordance with an aspect of the present invention.

A gas distribution system 54 is operably coupled to the chamber 44 for selectively providing gaseous chemicals into the chamber to form the thin film on the substrate 48. By way of illustration, the gas distribution system 54 includes a source of a gaseous medium (a vapor) of one or more chemical(s) that are to be formed on the substrate. The gas is provided into the chamber through a conduit that terminates in a nozzle, indicated at 56. While, for purposes of brevity, a single nozzle 56 is shown in FIG. 2, it is to be appreciated that more than one nozzle or other gas delivery mechanisms may be utilized to provide gas into the chamber 44 for film formation in accordance with an aspect of the present invention.

An oxidation system 58 also is provided for controlling oxidation temperature within the processing chamber 44. For example, the oxidation system 58 is a diffusion system (e.g., a horizontal or vertical furnace) operable to perform diffusions and/or oxidations on the substrate 48. The oxidation system 58 may implement its own temperature control process or such control may be implemented as part of other sensors 60 operatively associated with the processing chamber 44.

The system 40 also may include a load system 62 operatively connected to the chamber 44 for loading and unloading substrates (e.g., wafers) into and out of the processing chamber. The load system 62 typically is automated to load and unload the wafers into the chamber at a controlled rate.

The measurement system 42 is operative to measure film thickness in-situ, in accordance with an aspect of the present invention. In the example illustrated in FIG. 2, the measurement system 42 is a non-destructive optical measurement system, such as may utilize an optical interference, scatterometry or spectroscopic ellipsometry technique. The measurement system 42 includes a beam source and detector, schematically collectively indicated at 66. The beam source/detector 66 is located above the substrate 48. The source portion provides a light beam 68 toward an exposed surface of the substrate 48 at which the film is being formed. The beam 68 interacts with the surface and film and is reflected.

The reflected beam(s) 68, which is received at the detector portion of the source/detector 66, has beam properties (e.g., magnitude and/or phase), which may be employed to determine an indication of film thickness. A plurality of incident beams from one or more sources also may be directed at different spaced apart locations of the substrate to obtain corresponding measurements of film thickness substantially concurrently during the fabrication process. The concurrent measurements, in turn, provide an indication of the uniformity of film thickness across the substrate.

For the example of optical interference, the intensity of light over a selected wavelength varies as a function of film thickness. For spectroscopic ellipsometry, thickness varies based on the state of polarization of light reflected from the film, which is functionally related to the index of refraction of the material reflecting the beam 68.

By way of further illustration, the substrate 48 has gratings formed thereon, such as may be formed concurrently with alignment markings on the substrate. The gratings, for example, may range from about $10 \times 10 \,\mu m$ to about $100 \times 100 \,\mu m$, such as depending on the type of measurement tool being employed. The measurement system, in turn, may employ a scatterometry technique using spectroscopic ellipsometry to measure thickness of films being applied at the gratings. Thus, the measurement system 42 may measure properties of the wafer at opposed sides of the substrate 48 and near the center.

Using a scatterometry technique, for example, desired information concerning film thickness can be extracted by comparing the phase and/or intensity (magnitude) of the light directed onto the surface with phase and/or intensity signals of a complex reflected and/or diffracted light resulting from the incident light reflecting from and/or diffracting through the surface upon which the incident light was directed. The intensity and/or the phase of the reflected and/or diffracted light will change based on properties of the surface upon which the light is directed, including film thickness.

Different combinations of the above-mentioned properties will have different effects on the phase and/or intensity of the incident light resulting in substantially unique intensity/phase signatures in the complex reflected and/or diffracted light. The measurement system 42 provides information indicative of the measured properties to a control system 70. Such information may be the raw phase and intensity information. Alternatively or additionally, the measurement system 42 may be designed to derive an indication of film thickness based on the measured optical properties and provide the control system 70 with a signal indicative of the measured film thickness according to the detected optical properties. The phase and intensity of the reflected light can be measured and plotted.

In order to determine film thickness, for example, measured signal characteristics may be compared with a signal (signature) library of intensity/phase signatures to determine properties of the surface and, in particular, concerning the film thickness. Such substantially unique phase/intensity signatures are produced by light reflected from and/or refracted by different surfaces due, at least in part, to the complex index of refraction of the surface onto which the light is directed. The complex index of refraction (N) can be computed by examining the index of refraction (n) of the surface and an extinction coefficient (k). One such computation of the complex index of refraction can be described by the equation:

$$N = n - jk, \qquad \text{Eq. 1}$$

where j is an imaginary number.

The signal (signature) library can be constructed from observed intensity/phase signatures and/or signatures generated by modeling and simulation. By way of illustration, when exposed to a first incident light of known intensity, wavelength and phase, a first feature on a wafer can generate a first phase/intensity signature. Similarly, when exposed to the first incident light of known intensity, wavelength and phase, a second feature on a wafer can generate a second phase/intensity signature. For example, a particular type of thin film having a first thickness may generate a first signature while the same type of film having a different thickness may generate a second signature, which is different from the first signature. Observed signatures can be combined with simulated and modeled signatures to form the signal (signature) library. Simulation and modeling can be employed to produce signatures against which measured phase/intensity signatures can be matched. In one exemplary aspect of the present invention, simulation, modeling and observed signatures are stored in a signal (signature) library containing, for example, over three hundred thousand phase/intensity signatures. Thus, when the phase/intensity signals are received from scatterometry detecting components, the phase/intensity signals can be pattern matched, for example, to the library of signals to determine whether the signals correspond to a stored signature. Interpolation between the two closest matching signatures further may be employed to discern a more accurate indication of thickness from the signatures in the signature library. Alternatively, artificial intelligence techniques may be employed to calculate desired parameters of the wafer under test based on the detected optical properties.

While, for purposes of simplicity of illustration, the beam shown in FIG. 2 is illustrated as being generally perpendicular relative to the substrate, it is to be appreciated that the beam 68 may be oriented at other angles relative to the substrate 48 with a corresponding detector positioned at an opposite side of the substrate for receiving the reflected beam. In addition, more than one beam may be directed toward the surface at different locations to measure thickness at such different locations and, in turn, provide a measure of uniformity of thickness across the substrate. The thickness of the film being formed at the substrate 48 thus is determined based on the optical properties (e.g., n and k) of the emitted and reflected beams 68.

The other sensors 60, for example, monitor and/or measure selected conditions processing environment within the chamber 44. The other sensors 60, for example, may include a temperature sensor, mass flow sensor for gases, a pressure sensor, etc.

The various other subsystems and sensors 54, 58, 60, 62 further may provide respective signals to and/or receive control signals from the control system 70. Signals from the associated process systems 42, 54, 58, 60, 62 may indicate sensed operating conditions of the film formation process and/or operating conditions associated with the respective systems. The control system 70 in turn analyzes the conditions indicated by the received signals to discern whether the film formation process is being performed within expected operating parameters. The control system 70 also controls operating characteristics associated with the film formation process being implemented within the processing chamber 44 by providing appropriate control signals to the associated systems and/or sensors 42, 54, 58, 60, 62. Such control signals thus may adjust operating parameters of the wafer fabrication process when one or more detected parameters, including film thickness, are not within expected operating parameters (e.g., where film thickness is not uniform).

By way of example, the control system 70 includes a processor 72, such as a microprocessor or CPU, coupled to a memory 74. The processor 72 receives measured data from the measuring system 42 and corresponding other data from the other sensors 60. The processor 72 also is operatively coupled to the gas distribution system 54, the oxidation system 58, and the load station 62. The control system 70 is programmed/and or configured to control and operate the various components within the processing system 40 in order to carry out the various functions described herein.

The processor 72 may be any of a plurality of processors, such as the AMD K6, ATHLON or other similar processors. The manner in which the processor 72 can be programmed to carry out the functions relating to the present invention will be readily apparent to those having ordinary skill in the art based on the description provided herein.

The memory 74 serves to store program code executed by the processor 72 for carrying out operating functions of the system as described herein. The memory 74 may include read only memory (ROM) and random access memory (RAM). The ROM contains among other code the Basic Input-Output System (BIOS) which controls the basic hardware operations of the system 40. The RAM is the main memory into which the operating system and application programs are loaded. The memory 74 also serves as a storage medium for temporarily storing information such as temperature, temperature tables, position coordinate tables, interferometry information, thickness tables, and algorithms that may be employed in carrying out the present invention. The memory 74 also can hold patterns against which observed data can be compared as well as information concerning grating sizes, grating shapes, scatterometry information, achieved profiles, desired profiles and other data that may be employed in carrying out the present invention. For mass data storage, the memory 74 may include a hard disk drive.

A power supply 78 provides operating power to the system 20. Any suitable power supply (e.g., battery, line power) may be employed to carry out the present invention. The system further may include a display 80 operatively coupled to the control system 70 for displaying a representation (e.g., graphical and/or text) of one or more process conditions, such as film thickness, temperature, gas flow rates, etc. The display 80 further may show a graphical and/or textual representation of the measured optical properties (e.g., refraction index and absorption constant) at various locations along the surface of the substrate.

As a result, the system 40 provides for monitoring process conditions, including film thickness and other sensed process-related conditions, associated with the film formation process within the chamber 44. The monitored conditions provide data based on which the control system 70 may implement feedback process control so as to form a thin film having a desired thickness, such as a uniform thickness across the substrate.

Turning now to FIGS. 3, 4, and 5, a chuck 80 is shown in perspective supporting a wafer 82 whereupon one or more gratings or features may be located. As mentioned above, such gratings may be formed on the wafer 82 (e.g., by any suitable etching technique) at about the same time alignment markings are being applied. Such gratings may be applied near alignment markers, such as near extreme edges of the wafer. The wafer 82 further may be divided into a grid pattern as shown in FIG. 3. Each grid block (XY) of the grid pattern corresponds to a particular portion of the wafer 82, and each grid block has one or more gratings or features associated with that grid block. Each portion may be monitored individually for during application of layers and/or etching of the wafer. Alternatively, or additionally, selected locations along the surface of the wafer 82 may be monitored to help ensure proper film formation during the fabrication process. The size and/or shape of the gratings or features can be manipulated to facilitate analyzing different feature profiles. For example, for a particular layer in an IC, the slope of a trench wall may be important. Thus, the gratings can be patterned to optimize measuring such trench wall slope.

FIG. 4 illustrates a three-dimensional topographical map 84 of the wafer 82. In FIG. 4, one or more gratings in the respective portions of the wafer 82 ($X_1Y_1 \ldots X_{12}, Y_{12}$) are being monitored for thickness profiles produced during film formation using reflected, and/or passed through light, the measuring system 42 and the control system 70 (FIG. 2). The thickness profile measurements produced during fabrication for each grating are shown. As can be seen, the measurements at coordinate $X_7Y_6$ is not uniform relative to the profile measurement of the other portions XY. It is to be appreciated that although FIG. 4 illustrates the wafer 82 being mapped (partitioned) into grid block portions, the wafer 82 may be mapped with any suitable number of portions and any suitable number of gratings may be employed. Although the present invention is described with respect to one measurement corresponding to one grid block XY, it is to be appreciated that any suitable number of measurements could correspond to any suitable number of wafer portions.

FIG. 5 is an example of a representative table 86 of wafer measurements taken for the various grid blocks that have been correlated with acceptable profile values for the portions of the wafer mapped by the respective grid blocks. As can be seen, all the grid blocks, except grid block $X_7Y_6$, have profile measurements corresponding to an acceptable value ($T_A$) (e.g., are within an expected range of uniformity based on the thickness measurements). The grid block $X_7Y_6$, however, has an undesired feature profile table value ($T_U$), such as may correspond to a measured thickness that is either too thin or too thick relative the other measured portions. For example, based on the measurement data provided by the table of FIG. 5, the control system 70 (FIG. 2) may determine that an improper thickness exists at the portion of the wafer mapped by the corresponding grid block $X_7Y_6$. Accordingly, the control system 70 (FIG. 2) can drive the film formation process so as to correct the detected thickness abnormality relating to the portion of the wafer mapped at grid block $X_7Y_6$. This may include adjusting any of the process parameters being controlled by the control system.

As a result of measuring thickness of film being applied in-situ and adjusting process parameters, in accordance with an aspect of the present invention, a desired uniform application of film is facilitated. Further, the ability to measure one or more film thickness in-situ and to feed back measurement information concerning such layers facilitates accounting for etching variations within a wafer, leading to improvements over conventional systems.

Figure 6:
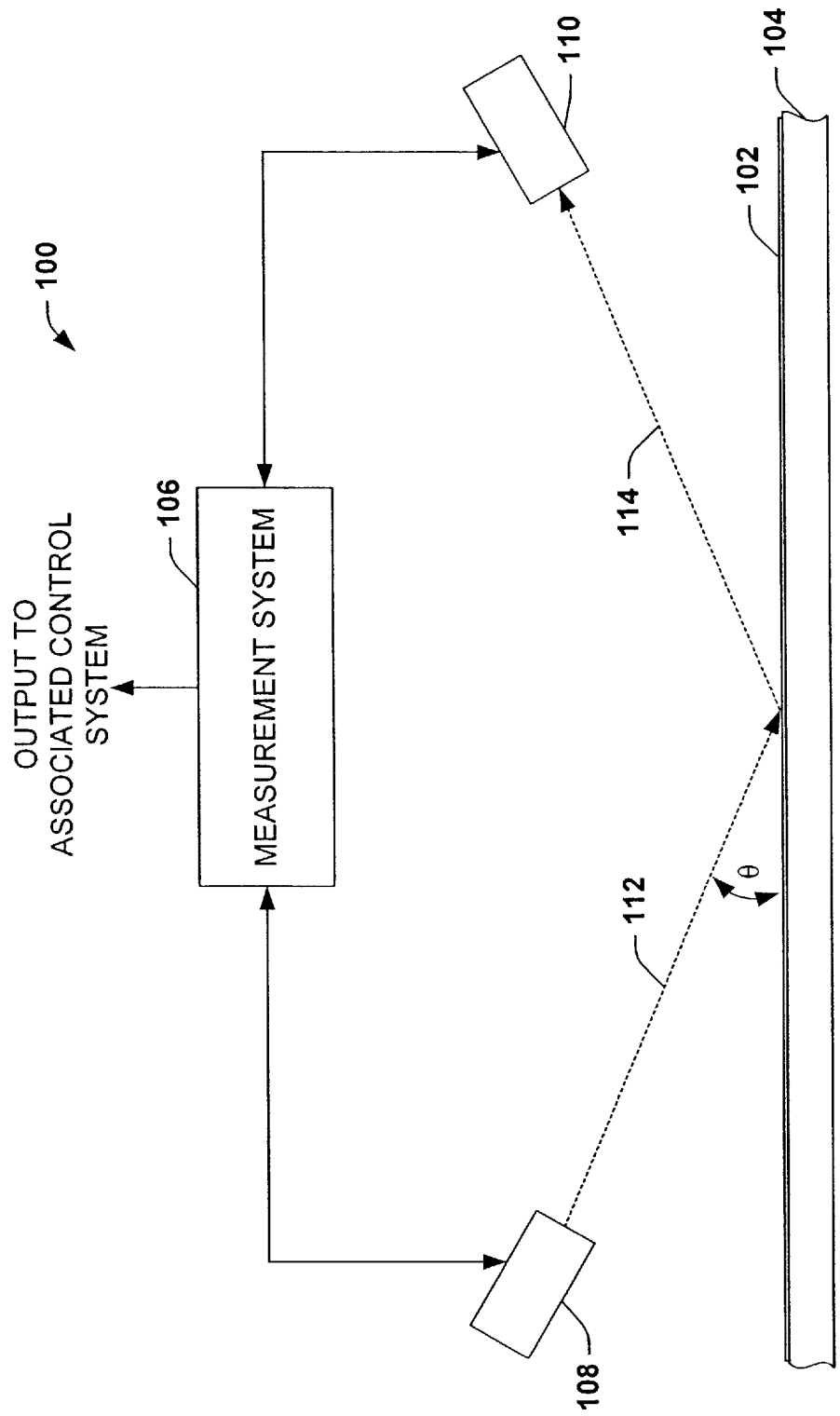
FIG. 6 is a block diagram illustrating an example of a measurement system that may be utilized in accordance with the present invention.

FIG. 6 illustrates an example of a non-destructive optical system 100 that may be implemented, in accordance with an aspect of the present invention, to measure the thickness of a thin film 102 as it is formed on a substrate 104. The optical system 100 includes a measurement system 106 coupled to an optical emitter 108 and to an optical detector 110. The emitter 108 emits a beam 112 a predetermined angle θ relative to the substrate 104 and thin film 104 being formed thereon. At least a portion of the beam is reflected, indicated at 114, and received at the optical detector 110. The emitter 108, for example, provides the light beam 112 at a known wavelength onto the surface of the substrate 104 and film 102. The incident beam 112 interacts with the surface and is reflected toward the optical detector 110.

By way of example, the optical system 100 may discern film thickness based on optical properties of the reflected beam 114 relative to the properties of an incident beam, such as according to a known scatterometry technique. The optical properties may include the phase and intensity (or magnitude) of the reflected light beam 114. For scatterometry, the wavelength of light being emitted as the incident beam 108 should be selected so that it is non-absorptive relative to the film 102 being measured. The phase and magnitude changes in the reflected light beam 114, for example, vary as a function of the optical constants of the film 102, such as the refraction constant (n) and absorption constant (k) and the film thickness. Because the optical constants of the substrate 104, which may be silicon, are known and the emitted light is non-absorptive to the film, the optical properties generally depend on the index of refraction, absorption constant, and the thickness of the film. The optical properties may be determined based on a comparison to known signal characteristics, such as may be stored as a signal (signature) library of intensity/phase signatures. As a result, the measurement system 106 (or its associated control system) is able to compute the thickness of the film 102 based on the measured optical properties of the beam 114 received at the detector 110.

In accordance with a particular aspect of the present invention, the measurement system further may collect measurement data substantially concurrently at spaced apart locations along the surface of the film being formed, such as at opposed side edges and a center location. The measurements made at spaced apart locations may be employed to determine uniformity of the film being formed across the surface of the substrate. Moreover, upon determining a generally non-uniform film, selected fabrication process parameters may be adjusted to facilitate uniform film formation.

Figure 7:
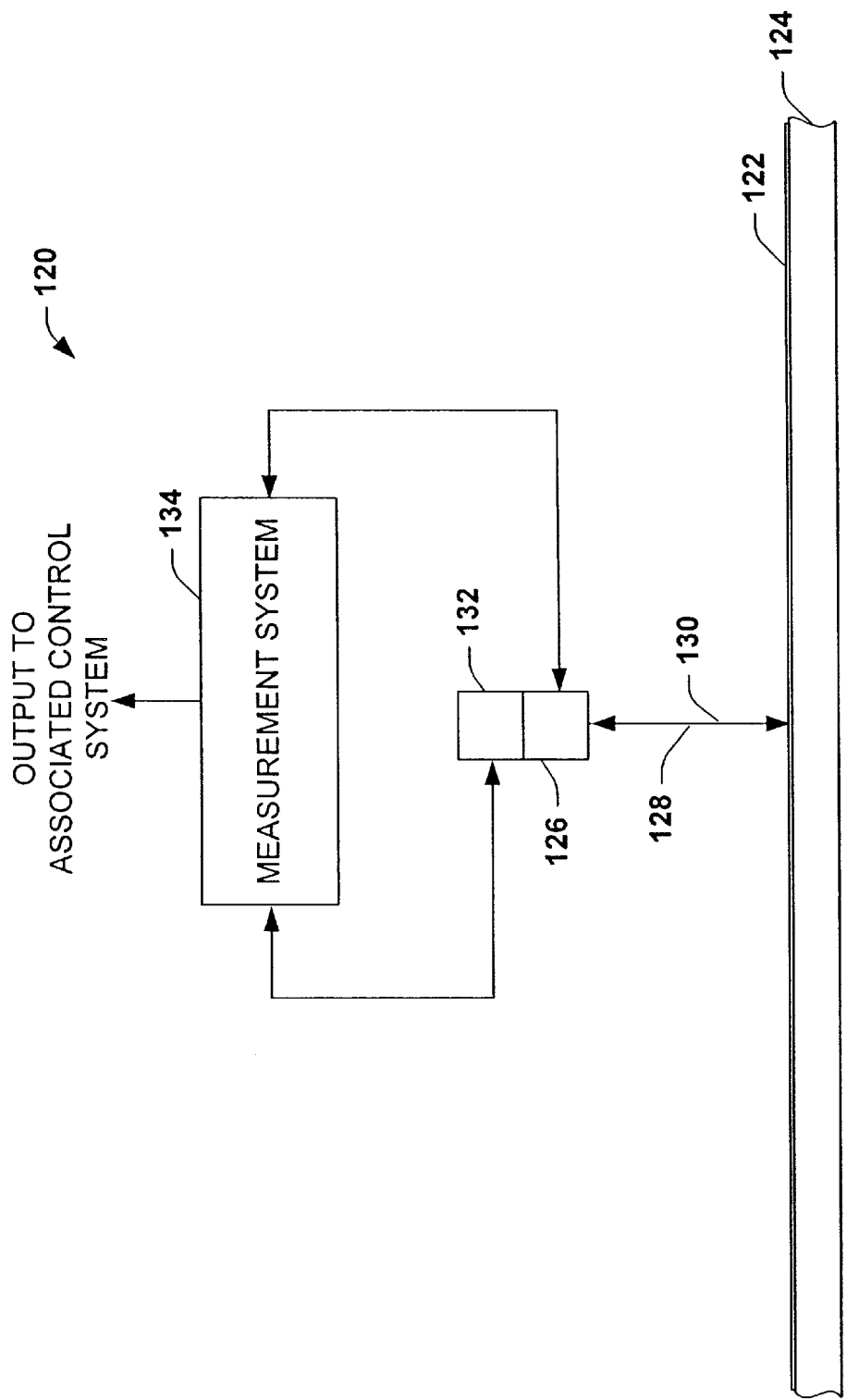
FIG. 7 is a block diagram illustrating another example of a measurement system that may be utilized in accordance with the present invention.

By way of further illustration, FIG. 7 illustrates an example of spectrophotometric technique 120 that may be employed to derive an indication of the thickness of a film 122 during its formation on a substrate 124. In the exemplary spectrophotometric technique of FIG. 4, a light source 126 emits a beam of light 128 is supplied at a fixed incident angle (e.g., about 90 degrees) relative to the substrate 124 and film 122. For example, the wavelength of the incident beam 128 is varied, such as between a wavelength in the range of about 480–790 nm. The light source 126, for example, is a frequency-stabilized laser; however, it will be appreciated that any laser or other light source (e.g., laser diode or helium neon (HeNe) gas laser) suitable for carrying out the present invention may be employed. The intensity of the reflected light beam 128 may be measured as a function of its wavelength, with a minimal intensity being used to calculate the film thickness. At least some of the incident light 128 is reflected as a reflected beam of light 130, which is received at an optical detector 132.

A measurement system 134, for example, may control the light source 126 and the detector 132 so as to derive an indication of the optical properties associated with the portion of the substrate 124 and/or film 122 with which the incident beam 128 interacts. The measurement system 134, in turn, may provide an indication of the measured optical properties to an associated control system. By way of example, the measurement system 134 may employ preselected values for the index of refraction to automatically calculate the film thickness from the measure properties of the reflected beam 130 relative to the incident beam 128. The information provided by the measurement system 134, for example, may include an indication of the thickness, such as based on analysis of the magnitude and phase of the incident and reflected light beams 128 and 130, respectively. Alternatively, the measurement system 134 may provide raw data to its association control system, which may employ such data to derive an indication of the thickness based on the measured optical properties, such as described hereinabove.

The measurement system 134, for example, controls the light source and detector components 126 and 132 to obtain measurements at selected locations across the surface of the film 122 and substrate 124, such as the central locations and spaced apart edge locations. By taking such measurements at different regions of the substrate 124, the associated control system may determine an indication of the uniformity of the film thickness. It is to be appreciated that, while a greater number of measurements may provide a better indication concerning uniformity of thickness, it also may require a greater processing capability. Consequently, a cost benefit analysis may accompany such measurements so as to help control the fabrication process to achieve an acceptable level of film thickness uniformity.

Figure 8:
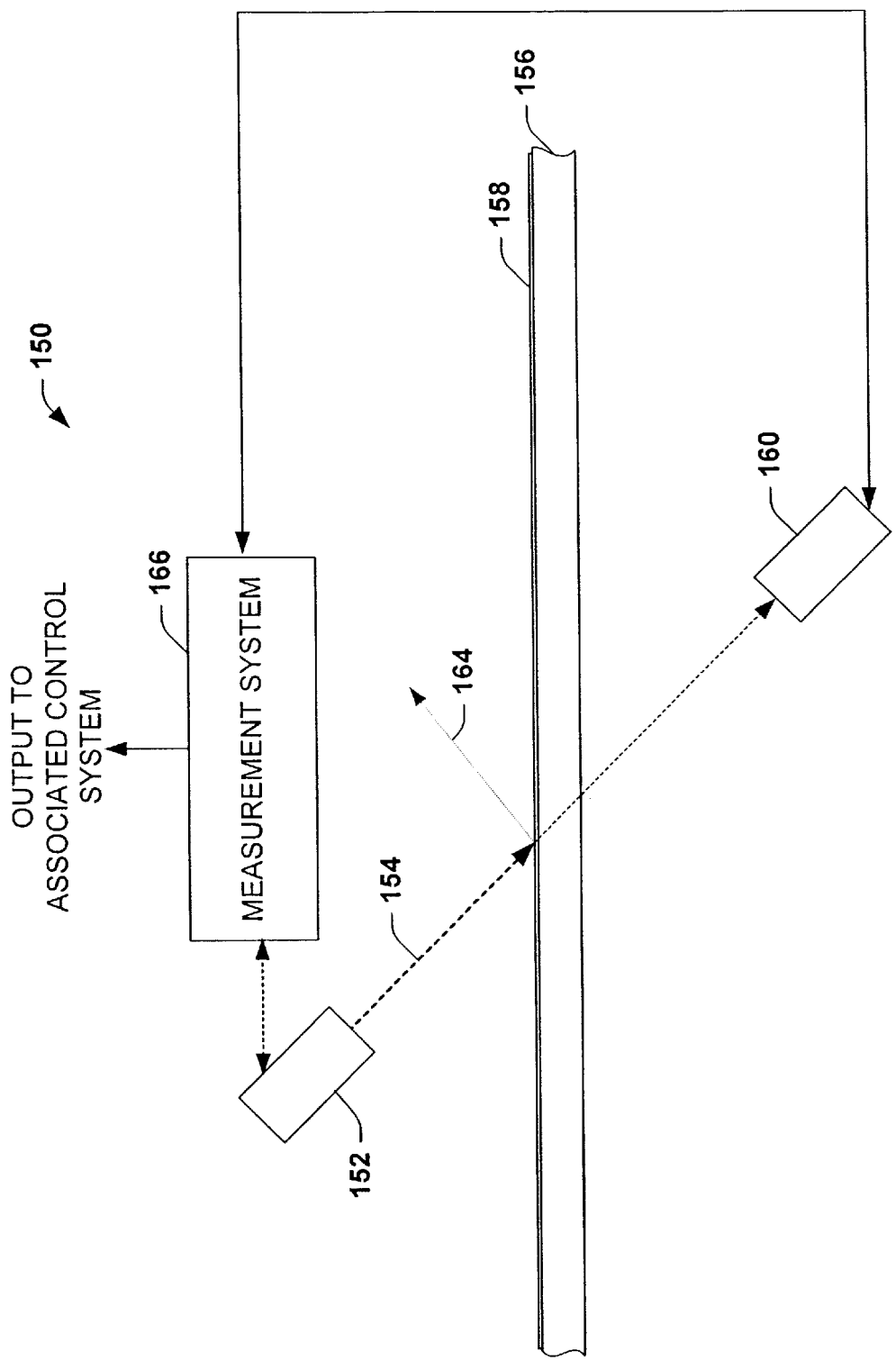
FIG. 8 is a block diagram illustrating another example of a measurement system that may be utilized in accordance with the present invention.

FIG. 8 illustrates an example of another type of scatterometry system 150 that may be employed to measure an indication of film thickness in-situ in accordance with an aspect of the present invention. In this example, the system 150 includes a light source 152 that supplies a beam of light 154 toward a wafer 156 having one or more layers 158. A detector 160 collects light 162 that passes through the wafer 156 and/or layer 158. Depending on the angle of the incident light beam 154 relative to the wafer 156 and layers 158, part of the incident beam may be reflected as a reflected beam 164. The detector 160 provides data concerning the collected light, to a measurement system 166.

The measurement system 166 further may control operation of the light source 152 and the detector 160. The measurement system 166 may process the data from the detector 160 indicative of the passed through or transmitted light 162 in accordance with scatterometry techniques to provide an associated control system (e.g., the control system 70 of FIG. 2) with data corresponding to the thickness of the film being formed on the wafer 156. Alternatively, the associated control system may determine thickness based on information provided by the measurement system 166. The associated control system thus may utilize the thickness data as feedback to control the one or more process parameters to mitigate errors associated with application of film onto the wafer 156 and, in turn, facilitate uniform formation of layers on the wafer 156.

As described above, scatterometry is a technique for extracting information about a surface upon which an incident light has been directed. Information concerning properties including, but not limited to, dishing, erosion, profile, thickness of thin films and critical dimensions of features present on a surface such as a wafer can be extracted. The information can be extracted by comparing the phase and/or intensity of the light directed onto the surface with phase and/or intensity signals of a complex reflected and/or diffracted light resulting from the incident light reflecting from and/or diffracting through the surface upon which the incident light was directed. The intensity and/or the phase of the reflected and/or diffracted light will change based on properties of the surface upon which the light is directed. Such properties include, but are not limited to, the chemical properties of the surface, the planarity of the surface, features on the surface, voids in the surface, and the number and/or type of layers beneath the surface. In the present invention, the intensity and/or phase of the reflected and/or diffracted light may be examined as it relates to profiles of film thickness and/or gratings on the wafer being fabricated. The determined thickness measurements, in turn, maybe employed as feedback during fabrication to adjust one or more operating characteristics of a film formation process to achieve a desired film thickness.

FIGS. 9, 10, 11, and 12 are directed to examples of various light patterns to further illustrate the principles of scatterometry described herein, such as may be employed in accordance with an aspect of the present invention to measure thickness of one or more layers of a wafer during fabrication. In each of these examples, the wafer includes a plurality of layers, which may have the same or different thicknesses.

Figure 9:
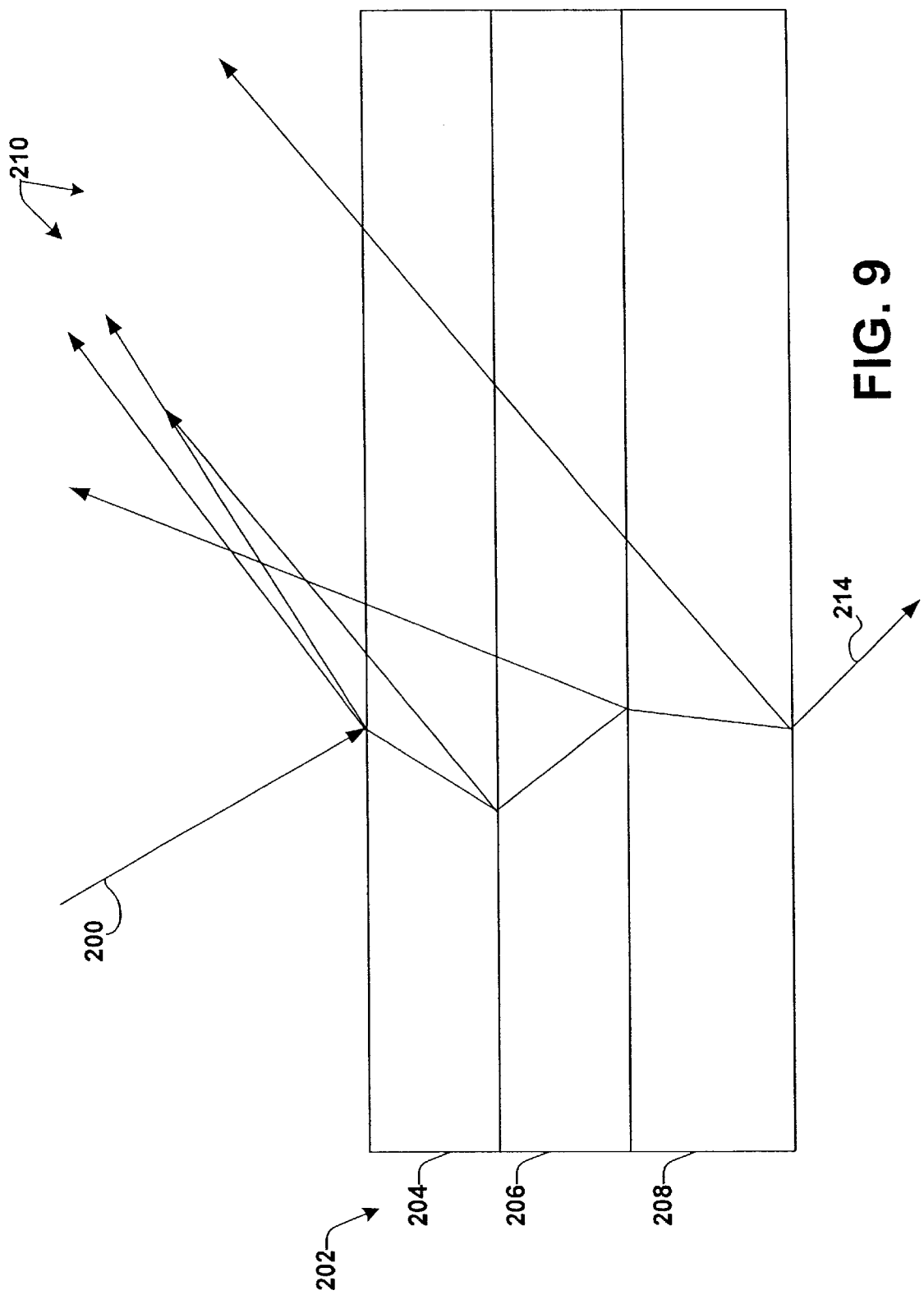
FIG. 9 illustrates an example of complex reflected and refracted light produced when an incident light is directed onto a surface.

FIG. 9 illustrates an incident light beam 200 being applied to a wafer 202 having a plurality of layers 204, 206, and 208 formed on the wafer. Although three layers 204, 206 and 208 are illustrated in FIG. 9, it is to be appreciated by one skilled in the art that a wafer can be formed of a greater or lesser number of such layers, such as may vary according to the stage in the fabrication process. As mentioned above, the incident light 200 produces complex reflected and/or refracted light 210, which can be affected by several factors, such as the composition of the substrate 202 and other properties of the substrate 202. Such physical properties, for example, may include the thickness and chemical properties of each layer 204, 206, 208 as well as their opacity and/or reflectivity. Thus, the complex reflected and/or refracted light 210 may result from the incident light 200 interacting with the substrate 202. In addition, depending on the scatterometry technique being used, some light 212 may pass through the substrate 202.

Thus, by monitoring optical properties of the substrate 202 during fabrication, one may detect variations in the thickness of a layer 204 being formed on the substrate. For example, the optical properties of the substrate 202 or one or more layers thereof may be determined based on the phase and magnitude of the reflected light 210 and/or of the transmitted light 214. The optical properties provide an indication of the thickness of the substrate 202 and/or its component layers 204–208. Detected variations in optical properties at spaced apart locations (e.g., near the center and diametrically opposed edges) further may indicate a non-uniform thickness of the top layer 204 being formed according to the locations where such measurements are being made. As described herein, an associated control system may implement feedback control based on the detected optical properties to adjust process parameters to help remedy the detected non-uniformity.

Figure 10:
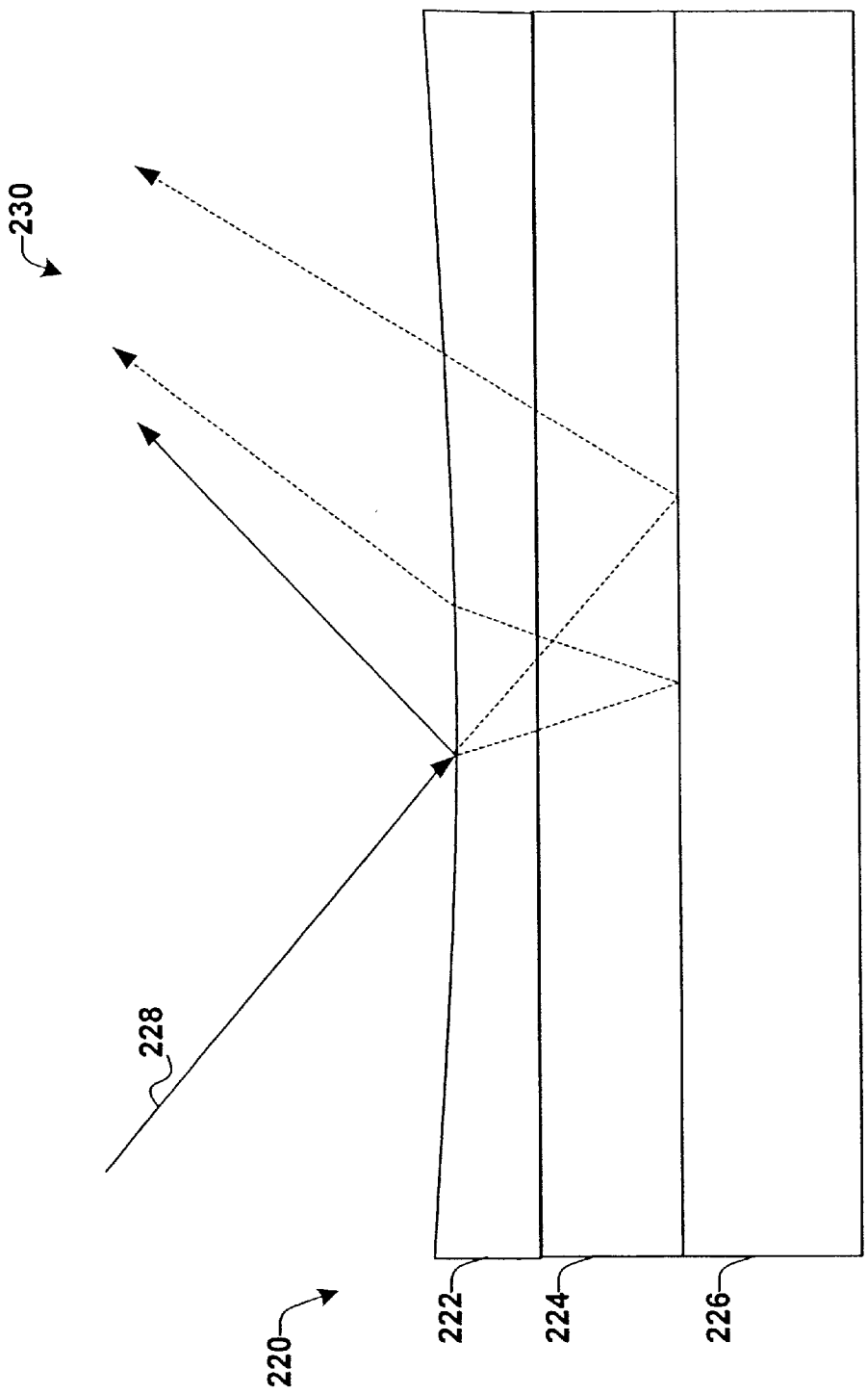
FIG. 10 illustrates another example complex reflected and refracted light produced when an incident light is directed onto a surface during part of a thin film formation process.
Figure 11:
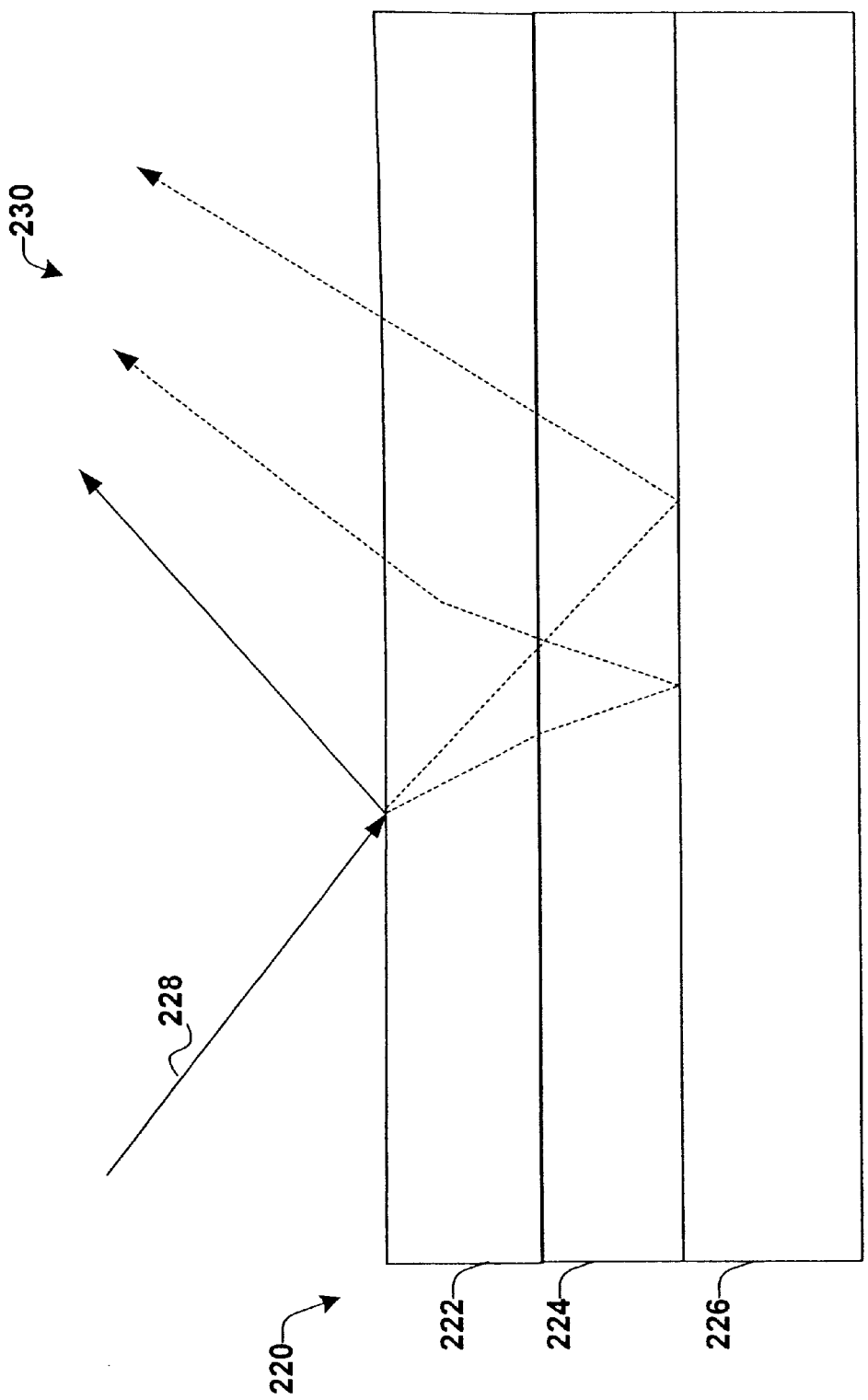
FIG. 11 illustrates another example complex reflected and refracted light produced when an incident light is directed onto a surface during another part of a thin film formation process.

FIGS. 10 and 11 illustrate parts of a substrate 220 at different times during fabrication, with like reference numbers being used to refer to like parts in such views. In particular, the substrate 220 includes a plurality of layers 222, 224, and 226, although any number of such layers could be used. In this example, an incident light 228 is directed at the surface of the layer 222 being formed during a film formation process during fabrication. Reflected and/or refracted light 230 results from the interaction of the incident light 228 with the substrate 220. In FIG. 10, for example, the layer 222 does not have a desired uniform thickness. Thus, by supplying the incident light 228 at different parts of the layer 222 variations in its thickness may be detected during fabrication. As described above, the variations in the thickness of the layer 222 are functionally related to the magnitude and/or phase of the reflected and/or refracted light 230, which may be determined from comparing signatures corresponding to the detected signals with a signature library.

FIG. 11 illustrates the substrate 220 at a subsequent part of the same fabrication process in which the layer 222 has been formed thicker and a substantial portion of the non-uniformity has been corrected. As described herein, the more uniform thickness of the layer 222 may be achieved by controlling process parameters during film formation, such as, for example, temperature, rate of rotation of a chuck and substrate 220 (e.g., during deposition), pressure and/or flow rate of fluid being applied to form the layer 222. Those skilled in the art will understand and appreciate other process parameters that may be adjusted during fabrication to help achieve a desired uniform thickness in accordance with the present invention. It is also to be appreciated that the level of attainable precision in thickness will depend at least in part to the number of measurements taken across the surface of the substrate.

Figure 12:
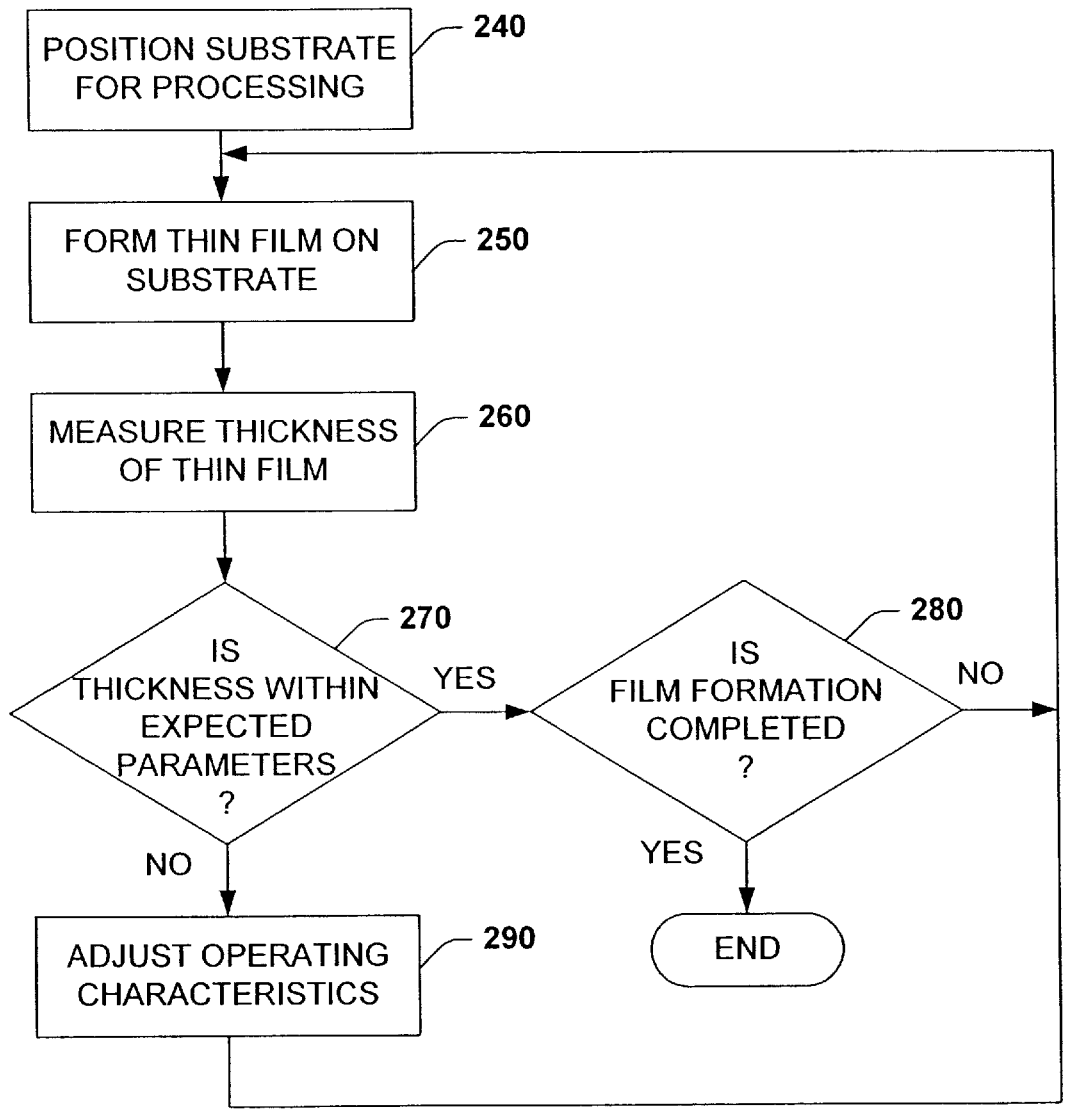
FIG. 12 is a flow diagram illustrating a methodology for measuring film thickness in accordance with the present invention.
Figure 13:
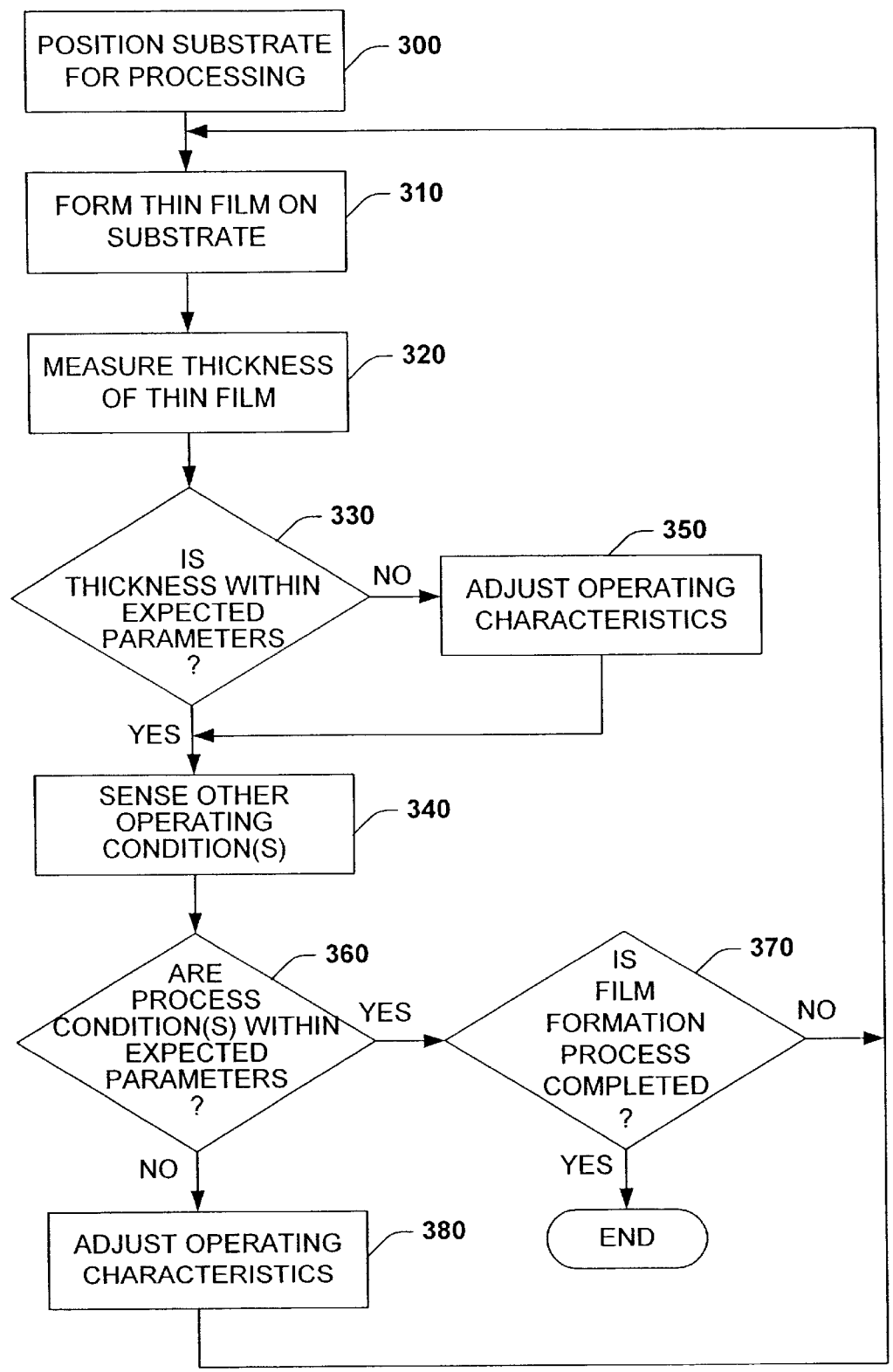
FIG. 13 is another flow diagram illustrating a methodology for measuring film thickness and process control in accordance with the present invention.

In view of the exemplary systems shown and described above, a methodology, which may be implemented in accordance with the present invention, will be better appreciated with reference to the flow diagrams of FIGS. 12 and 13. While, for purposes of simplicity of explanation, the methodologies of FIGS. 12 and 13 are shown and described as executing serially, it is to be understood and appreciated that the present invention is not limited by the illustrated order, as some blocks may, in accordance with the present invention, occur in different orders and/or concurrently with other blocks from that shown and described herein. Moreover, not all illustrated blocks may be required to implement a methodology in accordance with the present invention.

Turning now to FIG. 12, the methodology begins at 240 in which a substrate is positioned within an appropriate environment for desired processing. In this example, the processing is to include formation of a thin film, such as, for example, a metal (e.g., aluminum, copper, titanium-nitride, tungsten, etc.), semiconductors (e.g., oxides, nitrides, and poly, oxynitrides), or insulators.

After the substrate is positioned, the process proceeds to 250 in which a thin film formation process begins. As mentioned above, film formation may occur on a substrate, such as wafer, through a known deposition or film growth technique. The process then proceeds to 260.

At 260, the thickness of the thin film being formed is measured. By way of example, the film thickness is measured in-situ by a suitable optical technique, such as optical interference, scatterometry, spectroscopic ellipsometry, although other non-destructive thickness measuring techniques also could be utilized in accordance with the present invention.

From 260, the process proceeds to 270 in which a determination is made as to whether the measured thickness is within expected operating parameters. This determination, for example, may include a comparison of the measured thickness with an expected (or target) value, such as may be derived based on previous processes, calculations using monitored operating conditions within the processing chambers, and/or a combination thereof. For example, a signal signature indicative of reflected and/or refracted light may be compared relative to a signature library to provide an indication of the thickness based on its magnitude and/or phase of the reflected and/or refracted light. If the thickness is within expected operating parameters, the process proceeds to 280.

At step 280, a determination is made as to whether the film formation process is complete. If film formation is not yet complete, the process returns to 250 in which film formation and in-situ thickness monitoring may continue in accordance with an aspect of the present invention. If the film formation is complete, the process may end. It is to be appreciated that additional substrates may be processed in a similar manner.

If the determination at 270 is negative, indicating that the measured film thickness is not within expected operating parameters, the process proceeds to 290. At 290, operating characteristics associated with the process may be adjusted. By adjusting the operating characteristics, such as temperature, processing time, pressure, gas flow, etc., film formation may continue in a desired manner. As a result, errors in the thickness of the film being formed may be mitigated so as to achieve desired critical dimensions. Moreover, modifications may be made to the film formation process while the film is being formed, thereby reducing the number of process steps that are required to provide the desired film thickness.

FIG. 13 is another example of a flow diagram illustrating a methodology that may be employed, in accordance with an aspect of the present invention, to help form a thin film having a desired thickness. The methodology begins at 300 in which a substrate is positioned within an appropriate environment for desired processing. After the substrate is appropriately positioned, the process proceeds to 310 in which thin film formation (e.g., deposition or film growth) begins. The process then proceeds to 320.

At 320, the film thickness is measured in-situ. By way of example, the film thickness is measured by a suitable optical technique, such as a non-destructive optical interference, scatterometry, or spectroscopic ellipsometry technique, although other thickness measuring techniques also could be utilized in accordance with the present invention. From 320, the process proceeds to 330.

At 330, a determination is made as to whether the measured film thickness is within expected operating parameters, which parameters may vary according to the current stage of the film formation process. The measured thickness, for example, may be determined based on comparing a signal characteristics measured from reflected and/or refracted light relative to a signature library. If the film thickness is within expected operating parameters, the process proceeds to 340. If the film thickness is not within expected operating parameters, the process may proceed to 350. At 350, the operating characteristics of the film formation process may be adjusted as a function of the measured film thickness. From 350, the process continues to 340.

At 340, other operating conditions associated with the film formation process are sensed. By way of example, the other parameters may include temperature, gas flow rates, concentration of gases within the processing chamber, and pressure within the chamber. The process then proceeds to 360.

At 360, a determination is made as to whether the sensed parameters, which may include the condition(s) sensed at 340 and/or the film thickness sensed at 320, are within expected operating parameters. The detected process parameters, for example, are aggregated to provide a signature indicative of the overall process condition. The aggregate process condition thus may be compared relative to a stored aggregate signature values to determine if such conditions are within expected operating parameters. Alternatively or additionally other analysis techniques may be employed to discern whether the process as a whole is within expected operating parameters. IF the determination at 360 indicates that the process is within expected operating parameters, the process may proceed to 370. At 370, a determination is made as to whether the film formation process is complete. If film formation is not yet complete, the process returns to 310 in which film formation and process monitoring may continue in accordance with an aspect of the present invention. If the film formation process is complete, however, the process may end. Additional substrates may be processed in a similar manner.

If the determination at 360 is negative, indicating that one or more sensed operating conditions and/or the film thickness are not within expected operating parameters, the process proceeds to 380. At 380, operating characteristics associated with the process may be adjusted. The operating characteristics may include, for example, temperature, thermal oxidation time, the length of the film formation process (e.g., deposition time or film growth time), gas pressure, gas flow rates, etc. After selectively adjusting operating characteristics, the film formation process may return to 310 and continue in a desired manner.

As a result, errors in the thickness of the film being formed may be mitigated so as to achieve desired critical dimensions. Moreover, modifications may be made to the film formation process while the film is being formed, thereby reducing the number of process steps that are required to form the desired film thickness on the substrate.

What has been described above are examples of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications and variations that fall within the spirit and scope of the appended claims.

What is claimed is:

1. A semiconductor processing system, comprising:
    a processing chamber operable to form a thin film on a substrate located in the chamber;
    a measurement system for in-situ measuring a thickness of the thin film being formed and for providing a measurement signal indicative of the measured thickness;
    a control system for controlling operating characteristics of a thin film formation environment within the chamber, the control system adjusting the operating characteristics to control formation of the thin film based on the measurement signal; and
    a display operatively coupled to the control system and operative to display a visual representation of the measured thickness of the thin film during fabrication.

2. The system of claim 1, wherein the film formation process comprises chemical vapor deposition.

3. The system of claim 1, further including an oxidation system for controlling temperature of the processing environment to facilitate oxidation of the thin film.

4. The system of claim 3, wherein the operating characteristics comprise thermal oxidation time, the control system providing a control signal to control oxidation provided by the oxidation system based on the measurement signal.

5. The system of claim 1, wherein the operating characteristics comprise thermal oxidation time, the control system providing a control signal to control oxidation provided by the oxidation system based on the measurement signal and the another operating condition.

6. The system of claim 1, wherein the operating characteristics comprise a deposition time period during which the thin film is formed, the control system controlling the deposition time period based on the measurement signal and the another operating condition.

7. The system of claim 1, wherein the measurement system comprises an optical measurement system.

8. The system of claim 7, wherein the optical measurement system comprises at least one light source and an associated optical detector, the optical detector being operative to detect light from the substrate, which originated at the light source, and provide a detector signal having a characteristic indicative of thickness of the thin film based on at least one of magnitude and phase of the detected light.

9. The system of claim 8, wherein the optical measurement system determines thickness at a plurality of spaced apart locations of the substrate substantially concurrently, the control system determining an indication of uniformity in the thickness of the thin film and controlling the operating characteristics to control formation of the thin film based on the determined uniformity in the thickness of the thin film.

10. A system for monitoring thin film formation in a semiconductor fabrication process, comprising:
    means for measuring thickness of a thin film while being formed;
    means for providing a measurement signal indicative of the measured thickness of the thin film;
    means for controlling formation of the thin film, the control means adjusting operating characteristics associated with the thin film formation based on the measurement signal; and
    a display operatively coupled to the control system and operative to display a visual representation of the measured thickness of the thin film during fabrication.

11. The system of claim 10, wherein the operating characteristics comprise a deposition time period during which the thin film is formed, the control means controlling the deposition time period based on the measurement signal.

12. The system of claim 10, wherein the means for measuring further comprises at least one light source and an associated optical detector, the optical detector being operative to detect light from the substrate, which originated at the light source, and provide a detector signal indicative of the thickness of the thin film based on at least one of magnitude and phase of the detected light.

13. The system of claim 12, wherein the means for measuring determines thickness at a plurality of spaced apart locations of the substrate substantially concurrently, the control means determining an indication of uniformity in the thickness of the thin film and controlling the operating characteristics to control formation of the thin film based on the determined uniformity in the thickness of the thin film.

14. A method to facilitate formation of a thin film on a substrate, comprising:
    employing a processing chamber to form the thin film on the substrate located in the chamber;
    employing a measurement system to measure film thickness in-situ of the thin film while being formed at the substrate and to provide a measurement signal indicative of the measured thickness;
    employing a control system to control operating characteristics of a thin film formation environment within the chamber, the control system adjusting the operating characteristics to control formation of the thin film based on the measurement signal; and employing a display operatively coupled to the control system and operative to display a visual representation of the measured thickness of the thin film during fabrication.

15. The method of claim of 14 further comprising adjusting operating characteristics of thin film formation to control formation of the thin film as a function of the measured film thickness.

16. The method of claim 15 further including sensing another operating condition associated with the forming the thin film, the adjusting farther including adjusting the operating characteristics as a function of the measured film thickness and the another sensed operating condition.

17. The method of claim 16, wherein the operating characteristics comprise thermal oxidation time, the oxidation time being controlled based on the measured thickness of the thin film.

18. The method of claim 16, wherein the operating characteristics comprise a deposition time period during which the thin film is formed, the deposition time period being controlled based on the measured thickness of the thin film.

19. The method of claim 16, wherein the measuring further comprises collecting light from the substrate and determining the thickness based on at least one of a magnitude and phase of the collected light.

20. The method of claim 19, further wherein the measuring further comprises optically measuring thickness of the thin film at a plurality of spaced apart locations of the substrate substantially concurrently, and the operating characteristics being adjusted to control formation of the thin film based on the determined uniformity in the thickness of the tin film.

21. A semiconductor processing system, comprising:

a processing chamber operable to form a thin film on a substrate located in the chamber;

a measurement system for in-situ measuring a thickness of the thin film being formed and for providing a measurement signal indicative of the measured thickness;

a control system which controls operating characteristics associated with a thin film formation process within the chamber, the control system adjusting the operating characteristics to control formation of the thin film based on the thickness of the thin film; and a display operatively coupled to the control system and operative to display a visual representation of the measured thickness of the thin film during fabrication.

* * * * *